(12) United States Patent
Aoki et al.

(10) Patent No.: US 6,787,480 B2
(45) Date of Patent: Sep. 7, 2004

(54) MANUFACTURING METHOD OF SEMICONDCUTOR DEVICE

(75) Inventors: Hidemitsu Aoki, Tokyo (JP); Hiroaki Tomimori, Tokyo (JP); Norio Okada, Tokyo (JP); Tatsuya Usami, Tokyo (JP); Koichi Ohto, Tokyo (JP); Takamasa Tanikuni, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/071,184

(22) Filed: Feb. 11, 2002

(65) Prior Publication Data

US 2002/0155702 A1 Oct. 24, 2002

(30) Foreign Application Priority Data

Feb. 21, 2001 (JP) ........................................ 2001-044949

(51) Int. Cl.$^7$ ............................................ H01L 21/324
(52) U.S. Cl. .................. 438/775; 438/687; 438/798
(58) Field of Search ................................ 438/687, 775, 438/798, FOR 358, FOR 405, 627, 630, 631, 635, 643, 645, 906, FOR 111, FOR 355

(56) References Cited

U.S. PATENT DOCUMENTS

| | | |
|---|---|---|
| 5,447,887 A | 9/1995 | Filipiak et al. |
| 6,136,680 A | 10/2000 | Lai et al. |
| 6,150,269 A * | 11/2000 | Roy ............................ 438/687 |
| 6,165,894 A * | 12/2000 | Pramanick et al. .......... 438/627 |
| 6,174,810 B1 | 1/2001 | Islam et al. |
| 6,261,953 B1 * | 7/2001 | Uozumi ....................... 438/687 |
| 6,303,505 B1 * | 10/2001 | Ngo et al. ................... 438/687 |
| 6,352,938 B2 * | 3/2002 | Chen et al. .................. 438/725 |

FOREIGN PATENT DOCUMENTS

| | | | | |
|---|---|---|---|---|
| JP | 11330246 A | * | 11/1999 | ......... H01L/21/768 |
| JP | 2000-200832 A | | 7/2000 | |
| JP | 2000260769 A | * | 9/2000 | ....... H01L/21/3205 |
| JP | 2000269209 A | * | 9/2000 | ......... H01L/21/318 |
| JP | 2001210630 A | * | 8/2001 | ......... H01L/21/308 |
| JP | 2002246391 A | * | 8/2002 | ....... H01L/21/3205 |

OTHER PUBLICATIONS

Noguchi et al., "TDDB Improvement in Cu Metallization under Bias Stress", IEEE, 38$^{th}$ Annual International Reliability Physics Symposium, San Jose, CA, 2000, pp. 339–343.

S. J. Noguchi et al., "TDDB Improvement in Cu Metallization under Bias Stress", IEEE, 38th Annual International Reliability Physics Symposium, Can Jose, CA, 2000, pp. 339–343.

* cited by examiner

Primary Examiner—George Fourson
Assistant Examiner—Joannie Adelle Garcia
(74) Attorney, Agent, or Firm—Sughrue Mion, PLLC

(57) ABSTRACT

In order to provide a manufacturing method of a semiconductor device which can improve the interconnection lifetime, while controlling the increase in resistance thereof, and, in addition, can raise the manufacturing stability; by applying a plasma treatment to the surface of a copper interconnection 17 with a source gas comprising a nitrogen element being used, a copper nitride layer 24 is formed, and thereafter a silicon nitride film 18 is formed. Hereat, under the copper nitride layer 24, a thin copper silicide layer 25 is formed.

3 Claims, 9 Drawing Sheets

(a)

(b)

(c)

(d)

L1 : Measured Section of the Interconnection
L2, L3 : Interconnections lying at the Upper Level Than L1
V1 : Via Plug to Connect L1 with L2
V2 : Via Plug to Connect L1 with L3

MANUFACTURING METHOD OF SEMICONDCUTOR DEVICE

BACKGROUND OF THE INVENTION

The present invention relates to a manufacturing method of a semiconductor device which comprises the steps of forming a copper-containing film, and more particularly to a manufacturing method of a semiconductor device having an interconnection, an interconnection connecting plug, a pad section or such, made of copper or a copper alloy.

In recent years, copper and copper alloys have been widely used as the material for interconnections and connecting plugs to achieve higher speed operations in the elements. With these metals utilized, the interconnections and the likes are generally formed by the damascene method.

FIG. 5 is a series of views illustrating the steps of a conventional method of forming a copper interconnection. Now, this method is described below. First, as shown in FIG. 5(a), after an insulating film 10 and an interlayer insulating film 12 are formed, in this order, on a semiconductor substrate (not shown in the drawings), an interconnection trench is set within the interlayer insulating film 12, and thereon a barrier metal film 14 made of Ta; TaN or such and a seed copper film 15 are formed, in succession, and then a copper film 16 is formed by the plating method.

The semiconductor wafer 1 in this state is subjected to the chemical mechanical polishing (CMP) and copper lying outside of the interconnection trench is removed, while copper lying inside of the trench is left as it is, whereby a copper interconnection 17 is formed. At this, copper oxide 21 is produced on the copper interconnection 17, and a carboxylic acid cleaning is performed (FIG. 5(b)) for removing this copper oxide 21. In this way, copper oxide which may cause an increase in interconnection resistance or contact resistance can be eliminated (FIG. 5(c)). After that, as shown in FIG. 5(d), a silicon nitride film 18 is formed and thereon an interlayer insulating film 19 is formed.

In such steps of forming a copper interconnection, it is essential to remove copper oxide which is formed on the copper surface so that the electrical resistance may be prevented from increasing. While copper oxide is removed with carboxylic acid in the above method, other methods such as a method by a plasma treatment with a reducing gas are also known. For example, in a method described in "TDDB Improvement in Cu Metallization under Bias Stress" by J. Noguchi et al. (IEEE 38th Annual International Reliability Physics Symposium, San Jose, Calif. 2000, pp. 339–343), a plasma treatment with a hydrogen or ammonia gas is carried out to achieve the reduction of CuO which is formed on the surface of the copper interconnection to Cu, along with the formation of a Cu layer thereon. Moreover, it is described therein that once CuN is formed, this may function as a protective film, and when a copper-diffusion prevention film of SiN or the like is grown thereon, the CuN layer can suppress the formation of the copper silicide layer in the copper interconnection and, therefore, can restrain the increase in electrical resistance.

However, conventional techniques described above have the following problems.

In a method comprising the step of removing a copper oxide film with carboxylic acid, after the cleaning to remove the copper oxide film is carried out, the wafer is taken out from the cleaning equipment and transferred for the step of growing the films. During the transfer, the wafer may be exposed to the air so that the copper surface therein may be reoxidized, leading to a problem of the increase in electrical resistance and the decrease in adhesion between the copper interconnection and the copper-diffusion prevention film formed thereon.

Meanwhile, although a method with a reducing plasma treatment can control the increase in resistance in a certain degree, the method brings about another problem of the decrease in interconnection lifetime. In fact, it is the present inventors who first confirmed, through experiments, that a reducing plasma treatment may lower the interconnection lifetime, due to the electromigration or the like, and give rise to a variation in resistance. To remove the copper oxide film thoroughly by the plasma treatment, it is necessary to employ considerably rigorous conditions for the plasma treatment and, as a result, the copper surface becomes rugged. Furthermore, since the nitridation to form CuN proceeds with copper oxide still partially remaining on the copper surface, the film thickness of the CuN becomes non-uniform and, herewith, the film thickness of a copper silicide layer that is to be formed in the copper interconnection becomes also non-uniform. This presumably causes a lowering of the interconnection lifetime and produces variation in resistance.

Further, in the method using the reducing plasma treatment, there are occasions where the film thickness of the copper-diffusion prevention film becomes non-uniform, owing to the unevenness of the underlying layer surface. This necessitates, in the later step of hole etching to form an interconnection connecting plug, to perform overetching further more so as to remove that copper-diffusion prevention film so that the degradation of the copper interconnection surface may be brought about by the plasma exposure.

SUMMARY OF THE INVENTION

In light of the above problems, an object of the present invention is to provide a manufacturing method of a semiconductor device which can improve the interconnection lifetime and the variation in resistance of the copper interconnection, while controlling the increase in resistance thereof, and, in addition, can raise the manufacturing stability.

The present invention provides a method of manufacturing a semiconductor device; which comprises the steps of:
  forming a copper-containing film on a semiconductor substrate;
  removing, with a cleaning agent, a copper oxide on a surface of said copper-containing film;
  applying a nitriding treatment to the surface of said copper-containing film from which the copper oxide has been removed; and
  forming a copper-diffusion prevention film comprising a silicon on said copper-containing film which has been subjected to the nitriding treatment.

Further, the present invention provides a method of manufacturing a semiconductor device; which comprises the steps of:
  forming a copper-containing film on a semiconductor substrate;
  removing a copper oxide on a surface of said copper-containing film;
  applying an anticorrosive treatment to the surface of the copper-containing film, with an anticorrosive-containing solution being used;
  carrying out a heating treatment to detach the anticorrosive which is adhered onto the surface of the copper-containing film and, subsequently, applying a nitriding treatment to the surface of said copper-containing film; and forming a copper-diffusion prevention film comprising a silicon on said copper-containing film which has been subjected to the nitriding treatment.

Further, the present invention provides a method of manufacturing a semiconductor device; which comprises the steps of:

forming a copper-containing film on a semiconductor substrate; applying a nitriding treatment to the surface of said copper-containing film without allowing the semiconductor substrate to be exposed to an oxygen-containing atmosphere; and forming a copper-diffusion prevention film comprising a silicon on said copper-containing film which has been subjected to the nitriding treatment.

In the afore-mentioned manufacturing methods, a nitriding treatment is applied to the surface of a copper-containing film, after copper oxide which is present on the surface of the copper-containing film is removed with a cleaning agent. Or a nitriding treatment is applied to the surface of a copper-containing film without allowing a semiconductor substrate to be exposed to an oxygen-containing atmosphere. In the method described in the BACKGROUND, wherein a copper oxide film is removed by a plasma treatment with a reducing gas, it is necessary to conduct the plasma treatment under somewhat rigorous conditions. For instance, in order to remove copper oxide, the plasma atmosphere is required to have a high reducing capability. This makes the surface of the copper-containing film rugged, causing the increase in interconnection resistance and contact resistance. Contrary to this, the plasma treatment in the present invention can be carried out under milder conditions, because the treatment does not aim at removing copper oxide.

Further, in the afore-mentioned conventional techniques, even if the treatment is conducted in a plasma atmosphere with a high reducing capability, a copper oxide film cannot help remaining in part. As against this, in the present invention, since the nitriding treatment is applied to a clean copper surface where no copper oxide film remains, the film thickness and the film quality of a CuN film which is formed by the nitriding treatment can be made uniform and, herewith, the film thickness of a copper silicide layer to be formed in the copper interconnection becomes uniform. As a result, the following effects can be attained.

First, the increase in electrical resistance which may be brought about by oxidation of the copper-containing film surface can be suppressed. In the afore-mentioned manufacturing methods, a protective film made of CuN is homogeneously formed to an uniform thickness over the copper-containing film so that a clean copper-containing metal surface where no copper oxide film is formed is directly covered with the protective film. This protects copper from oxidation with effect in the subsequent steps, and prevents the electrical resistance from increasing.

Secondly, the interconnection lifetime is lengthened. In the afore-mentioned manufacturing methods, CuN is formed, while the nitriding treatment is being applied to the surface of the copper-containing film, and once a copper-diffusion prevention film comprising silicon is formed, this CuN restrains silicon from diffusing into the copper-containing film. However, CuN does not cut off the silicon diffusion completely, and a small amount of silicon passes through CuN and reaches inside of the copper-containing film to form a thin copper silicide layer in the vicinity of the surface of the copper-containing film. As described above, the protective film made of CuN is homogeneously formed to a uniform thickness so that the silicide layer formed thereunder is a thin layer, homogeneous and having a uniform thickness. The formation of such a silicide layer is considered to be the cause for lengthening of the interconnection lifetime. A silicide layer of this sort can be also formed by the step of forming a silicon nitride film 18, in the method described in the BACKGROUND, referring to FIG. 5. However, because silicon nitride, in this instance, is deposited without a copper nitride layer being formed, silicon that is the very constituting material for silicon nitride diffuses into the copper interconnection, excessively, and a thick silicide layer is formed, causing a problem of the increase in interconnection resistance and contact resistance. Meanwhile, in the afore-mentioned method with a reducing plasma treatment, the formation of a silicide layer itself is considered to be suppressed. Unlike these conventional techniques, in the present invention, because a CuN layer, capable to restrain silicon diffusion appropriately, is formed, a silicide layer can be formed homogeneously and uniformly to a thin film thickness. This enables both objects, an improvement of the interconnection lifetime and a lowering of the electrical resistance, to be achieved together.

Thirdly, because the copper-diffusion prevention film can be formed homogeneously and with its film thickness well under control, the degradation of the copper-containing film in the subsequent steps can be prevented from occurring. For instance, when the present invention is applied to a method of forming a copper interconnection, after copper interconnection made of a copper-containing film is formed, an interconnection connecting plug is to be formed thereon. In the step of hole etching, thereat, it is required to remove the copper-diffusion prevention film and expose the copper interconnection. In order to remove the copper-diffusion prevention film lying in a plurality of holes for sure, it is essential to make a certain amount of overetching. Nevertheless, in the present invention, as the copper-diffusion prevention film can be formed homogeneously and with its film thickness well under control, the film thickness for the copper-diffusion prevention film itself can be made thinner than the conventional one, and, as a result, the amount of overetching can be well reduced. Doing this, the alteration of the resist form can be lessened and the linewidth accuracy of the fabricated form, heightened. Further, the thickness of the resist can be reduced so that more minute fabrication thereof can be made. In addition, the amount of deposits generated after etching may drop, and besides shavings and damages of the underlying copper interconnection due to overetching can be reduced. Further, as the film thickness of the copper-diffusion prevention film can be set thin, parasitic capacitances between horizontally adjacent interconnections and within the interconnection along the direction of the substrate thickness can be reduced. As a result, cross talk between interconnections can be suppressed.

In the afore-mentioned manufacturing methods of a semiconductor device, the nitriding treatment of the copper-containing film surface can be effected by a plasma treatment using a source gas comprising a nitrogen element. Further, following the step of removing copper oxide, and prior to the step of applying a nitriding treatment to the surface of a copper-containing film, the step of applying an anticorrosive treatment to the surface of the copper-containing film with an anticorrosive-containing solution may be carried out. Further, after the step of applying the anticorrosive treatment to the surface of the copper-containing film, the step of a heating treatment to detach the anticorrosive which is adhered onto the surface of the copper-containing film and, subsequently, the step of applying a nitriding treatment to the surface of the copper-containing film may be carried out. Hereat, if the aforementioned heating treatment is carried out in a vacuum and, thereafter, keeping the vacuum as it is, the step of applying the nitriding treatment to the surface of the copper-containing film is performed, the nitriding treatment can be applied to the surface of the copper-containing film which is in a clean state, the film thickness and quality for the copper nitride layer and copper silicide layer can be advantageously made more uniform.

As set forth above, the present invention can make the film thickness and the film quality of CuN that is formed by the nitriding treatment uniform and, herewith, can form a copper silicide layer to an uniform thickness in the copper interconnection. Consequently, the present invention can improve the interconnection lifetime, while preventing the resistance of a copper-containing film from increasing. Furthermore, because the present invention can form a copper-diffusion prevention film homogeneously with a film thickness well under control, it is possible to prevent the degradation of the copper containing film from occurring in the subsequent steps.

BRIEF DESCRIPTION OF THE DRAWINGS

The above and other objects of the invention will become apparent upon making reference to the accompanying drawings.

Figure 1:
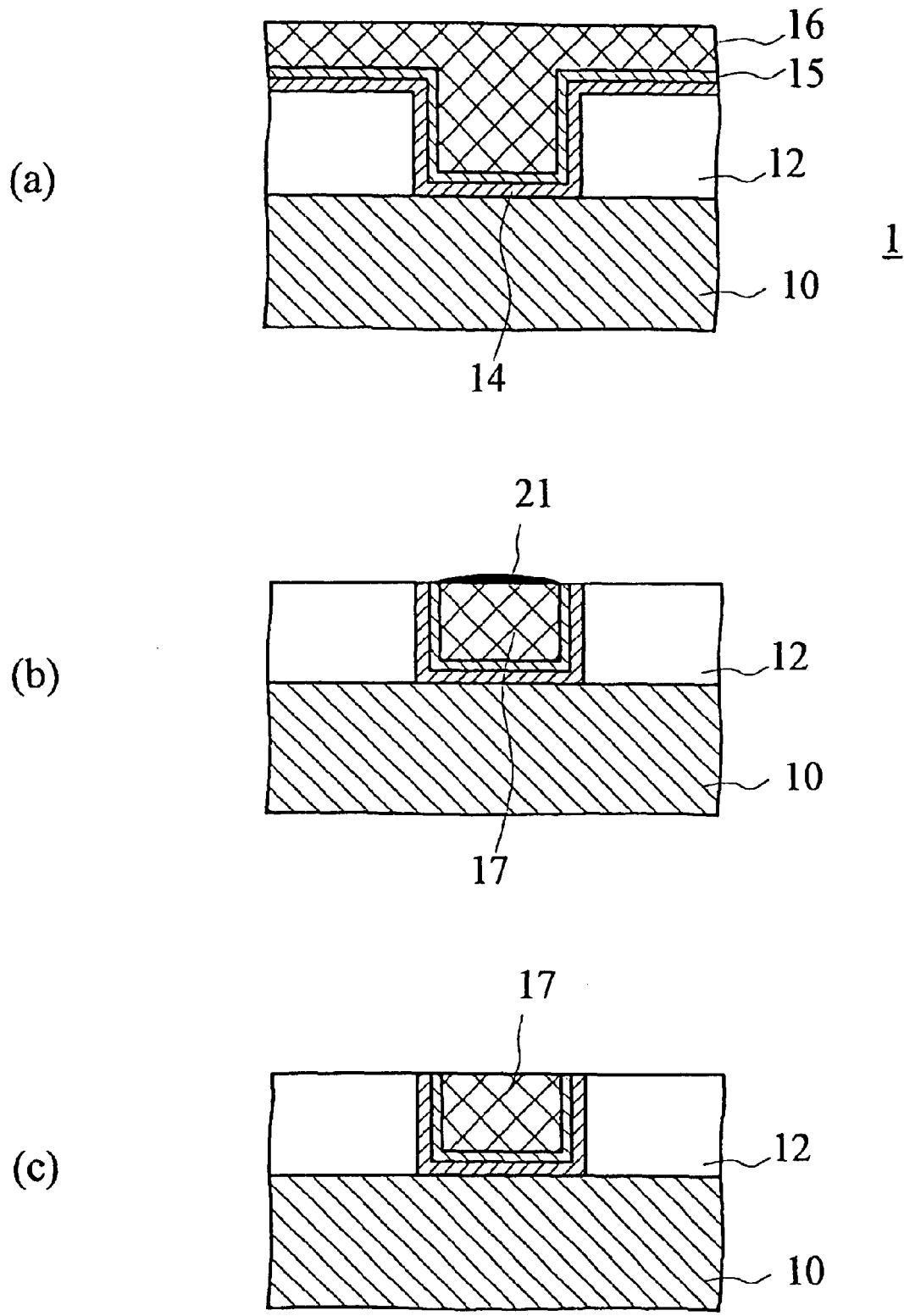
FIG. 1 is a series of schematic cross-sectional views illustrating the steps of a manufacturing method of a semiconductor device according to the present invention.

In the accompanying drawings, referential numerals mean as follows; 1: silicon wafer, 10: insulating film, 12: interlayer insulating film, 14: barrier metal film, 15: seed copper film, 16: copper film, 17: copper interconnection, 18: silicon nitride film, 19: interlayer insulating film, 21: copper oxide, 22: anticorrosive, 24: copper nitride layer, 25: copper silicide layer, 27: interlayer connecting plug.

DETAILED DESCRIPTION

A copper-containing film as used in the present invention is either a copper film or a copper alloy film which contains at least 80 wt. % of copper and preferably at least 90 wt. % of copper. A copper alloy contains, as another component, a different element such as Mg, Se, Zr, Hf, Nb, Ta, Cr, Mo, or the like.

A copper-diffusion prevention film as used in the present invention is a film comprising a silicon, which is set to prevent copper from diffusing into and within the interlayer insulating film and is made of, for example, SiN, SiON, SiC, SiCOH or the like.

In the present invention, a solution, especially an aqueous solution containing any of carboxylic acid compounds is preferably used as a cleaning agent. Carboxylic acid compounds as used herein include carboxylic acids and their salts. It is preferable to employ one or more compounds selected from the group consisting of oxalic acid, citric acid, malic acid, maleic acid, succinic acid, tartaric acid, malonic acid and their salts. Among these compounds, oxalic acid, in particular, is preferably used owing to its effectiveness to remove copper oxide. Oxalic acid has a good capability to form a chelate complex effectively with copper oxide, once copper oxide is produced by the Cu-CMP. Meanwhile, copper atoms in the Cu film constituting the interconnection are held together by the metallic bonding so that they are hard to form a complex with oxalic acid and spared from being etched. In addition, since metals such as TiN, Ta, TaN, and TaSiN that may constitute a barrier film are also hard to form a complex with oxalic acid, they are also spared from being etched. Therefore, through the use of oxalic acid, CuOx in the form of a film and Cu particles that remain on the surface can be selectively removed, without etching the copper-containing film or the barrier metal film. The total content of carboxylic acid with respect to the whole amount of the cleaning agent is set to be preferably 0.005–10 wt. % and more preferably 0.01–1 wt. %.

The cleaning agent as used in the present invention may contain a complexing agent. As a complexing agent, any of polyaminocarboxylic acid compounds or ammonium fluoride may be preferably used. Among polyaminocarboxylic compounds, compounds such as ethylenediaminetetraacetic acid (EDTA), trans-1,2-cyclohexanediaminetetraacetic acid (CyDTA), nitrilotriacetic acid (NTA), diethylenetriaminepentaacetic acid (DTPA), N-(2-hydroxyethyl) ethylenediamine-N, N',N'-triacetic acid (EDTA-OH) and their salts are preferable. If a salt is to be employed, a salt that does not adversely affect characteristics of the semiconductor device is preferable, and especially a salt containing no metal such as ammonium salt is preferable. The content of the complexing agent to the whole cleaning agent is set to be preferably 1–10,000 ppm, and more preferably 10–1,000 ppm. When this concentration is too low, a sufficient chelating effect cannot be obtained. On the other hand, if the concentration is excessively high, organic materials may remain on the substrate surface, which causes deterioration of the performance of the semiconductor element or increase in the cost required for the treatment of the waste fluid.

The cleaning agent as used in the present invention may contain an anion-based or a cation-based surfactant. Examples of an anion-based surfactant include carboxylic acid type ones, sulfuric acid type ones and sulfuric ester type ones, in other words, acids having a —COOH group, a —SO$_3$H group and a —OSO$_3$H group and their salts. If a salt is to be employed, ammonium salt or primary, secondary or tertiary amine salt having a little adverse effect on the quality of the semiconductor device that is the very object for the cleaning is preferable. As specific examples of an anion-based surfactant, there can be given, for example, $C_{12}H_{25}O(CH_2CH_2O)_2SO_3H$, $C_9H_{19}PhO(CH_2CH_2O)_4SO_3H$, $C_{12}H_{25}O(CH_2CH_2O)_4SO_3H$, (Ph is a phenylene group) and their ammonium salts as well as their primary, secondary and tertiary amine salts. Among the above surfactants, ammonium salts of sulfuric ester and their primary, secondary and tertiary amine salts, which have the particularly strong removing effect on metal contaminations adhered to the surface in the metal region, are preferable. As examples of a cation-based surfactant, there can be given $C_8H_{17}N(CH_3)_3$ Br, $C_{12}H_{25}N(C_2H_5)(CH_3)_2$ Br and the like.

In the present invention, the amount of the anion-based or the cation-based surfactant to be used is appropriately determined, according to the type of the surfactant, but is set to be preferably 1–1,000 ppm, and more preferably 10–500 ppm, by weight, with respect to the cleaning agent for the substrate. When the added amount is too small, a sufficient cleaning effect may not be obtained. On the other hand, with an excessively large amount, the treatment of the waste fluid may become difficult.

In the present invention, for an anticorrosive, there can be used benzotriazole (referred to as BTA, hereinafter), its derivatives, uric acid, its derivatives or such. Through the use of any of these anticorrosives, excellent anticorrosive effect on the metal such as copper can be obtained.

As a benzotriazole derivative, any of IRGAMET Series placed on the market by Ciba Speciality Chemicals, and more specifically IRGAMET 42 is preferably used. IRGAMET 42 is 2,2'-[[(methyl-1H-benzotriazole-1-y1)methyl]imino]bis-ethanol.

Examples of a uric acid derivative include: purine; derivatives of purine such as 6-aminopurine, 2-amino-6-oxopurine, 6-furfurylaminopurine, 2,6-(1H,3H)-purinedione, 2-amino-6-hydroxy-8-mercaptopurine, allopurinol, uric acid, kinetin, zeatin, guanine, xanthine, hypoxanthine, adenine, theophylline, caffeine and theobromine; 8-azaguanine; derivatives of 8-azaguanine; pteridine; derivatives of pteridine such as 2-amino-4,6-dihydroxypteridine, 2-amino-4,7-dihydroxypteridine and 2-amino-4,6,7-trihydroxypteridine; pterin; derivatives of pterin; cyanuric acid; derivatives of cyanuric acid such as triscarboxymethylcyanuric acid and triscarboxyethylcyanuric acid; isocyanuric acid; derivatives of isocyanuric acid such as triscarboxymethylisocyanuric acid and triscarboxyethylisocyanuric acid; hydantoin; derivatives of hydantoin such as dimethylhydantoin; allantoin (5-ureidohydantoin); derivatives of allantoin; barbituric acid; derivatives of barbituric acid; nicotinic acid; and derivatives of nicotinic acid such as isonicotinic acid and citrazinic acid. Each of these substances can be used independently, or two or more of them can be used together.

Among these substances described above, purine, derivatives of purine, cyanuric acid, derivatives of cyanuric acid, isocyanuric acid, derivatives of isocyanuric acid, nicotinic acid, and derivatives of nicotinic acid are preferably used, because they demonstrate excellent anticorrosive effect on the metal such as copper.

In the present invention, an anticorrosive is preferably used as an aqueous solution, and, thereat, the minimum amount of the anticorrosive to be mixed into the aqueous solution is set to be preferably 0.0001 wt. % and, more preferably 0.001 wt. %. With such an amount mixed, the protection against corrosion can be made substantial. The maximum amount of the anticorrosive mixed thereinto is not particularly limited and set appropriately, depending on its solubility in the aqueous solution. The maximum amount to be mixed for BTA and its derivatives is set to be preferably 1 wt. % or so, and the maximum amount for uric acid derivatives is set to be, for example, 20 wt. % or so, and preferably 10 wt. % or so. Hereat, an inhibitor for precipitation of the anticorrosive, made of an amine compound or such, may be added to the anticorrosive, as the occasion may demand.

In the present invention, it is preferable that, after the step of an anticorrosive treatment, the step of a heating treatment wherein the anticorrosive adhered onto the surface of the copper-containing film is detached by a heating treatment is carried out and, then, the step of a nitriding treatment follows. Further, it is preferable that the step of the aforementioned heating treatment is carried out in a vacuum and, thereafter, keeping the vacuum as it is, the step of the nitriding treatment is performed. Since this arrangement enables the nitriding treatment to be applied to the copper surface which is in a clean state, the film thickness and the quality for the copper nitride layer and the copper silicide layer can be made uniform, and thus, the interconnection lifetime can be lengthened, while lowering the interconnection contact resistance.

Next, referring to the drawings, one example of a method of manufacturing a semiconductor device according to the present invention is described below.

Firstly, as shown in FIG. 1(a), on a silicon wafer, an insulating film 10 and an interlayer insulating film 12 are formed in this order and, then, a plurality of interconnection trenches patterned into a prescribed shape are formed by dry etching. For the material of the interlayer insulating film 12, in addition to silicon oxide, low-dielectric-constant materials, for example, polyorganosiloxanes such as MSQ (methylsilsesquioxane) and MHSQ (methylated hydrogen silsesquioxane) and aromatic organic materials such as polyallyl ether (PAE) and divinylsiloxane-bis-benzocyclobutane (BCB) can be utilized.

Next, after a barrier metal film 14 is grown over the entire surface by the sputtering method, a seed copper film 15 is formed by the sputtering method and then a copper film 16 is formed by the plating method. For the material of the barrier metal film 14, metal materials such as Ta, TaN, W, WN, Ti and TiN can be used. In the present embodiment, copper is employed as the interconnection material, although a copper alloy may be also used.

Subsequently, the wafer surface is polished by the CMP method so that a copper interconnection, as shown in FIG. 1(b), may be formed. Hereat, by the effect of an oxidizing agent contained in a CMO slurry, the surface of the copper interconnection 17 may be oxidized to form copper oxide 21. Accordingly, a cleaning to remove this copper oxide 21 is carried out. For the cleaning agent, a solution containing carboxylic acid such as oxalic acid, maleic acid, succinic acid or acetic acid is preferably used.

After the cleaning, with carbon oxide removed, a clean surface of the copper interconnection 17 is exposed (FIG. 1(c)). Next, a treatment with an anticorrosive is performed so as to adhere the anticorrosive 22 onto the surface of the copper interconnection 17 (FIG. 2(a)). As examples of the anticorrosive 22, as described above, there can be given BTA and its derivatives, and uric acid and its derivatives. By making the anticorrosive 22 adhered thereto, copper can be well protected from oxidation, even if the wafer is exposed to the air or left in the air for several days.

Figure 2:
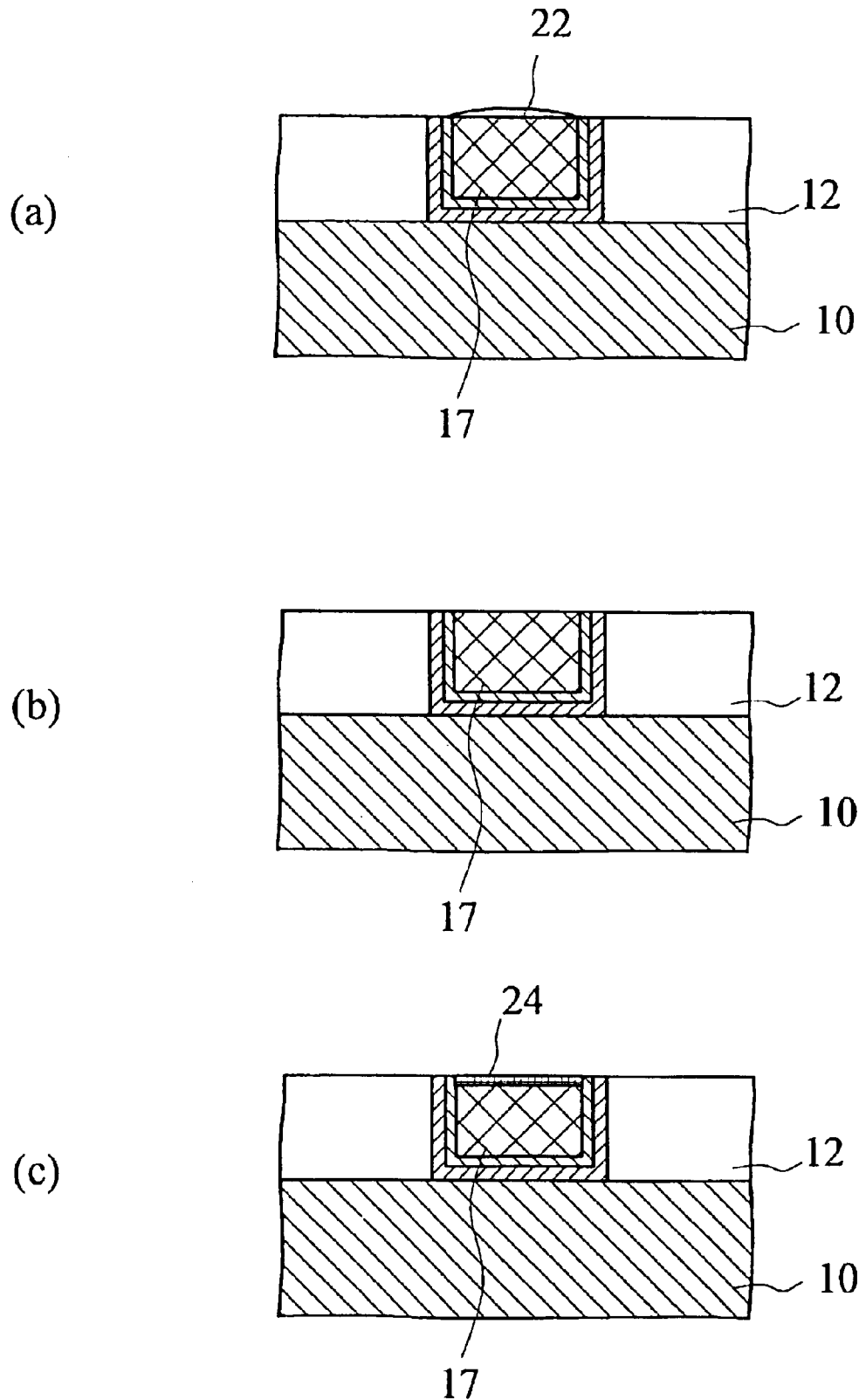
FIG. 2 is a series of schematic cross-sectional views illustrating further steps of the manufacturing method of a semiconductor device according to the present invention.

Next, by heating the wafer, the anticorrosive 22 is vapourized (FIG. 2(b)). For example, when BTA is utilized as the anticorrosive, BTA can be removed almost completely by a heating treatment at a temperature equal to or higher than 200° C. This heating treatment for detachment of the anticorrosive is conducted preferably at a temperature of 200–500° C., and more preferably at a temperature of 300–450° C. Such a treatment can effectively detach the anticorrosive therefrom without affecting the elements therein adversely.

At this stage, the surface of the copper interconnection 17 is made to be, in the absence of copper oxide and anticorrosive, in a clean state. In such a state, the copper surface is subjected to a nitriding treatment. In the present embodiment, a plasma treatment is performed, using a source gas containing nitrogen and ammonia. With this plasma treatment, a copper nitride layer 24 is formed on the surface of the copper interconnection 17 (FIG. 2(c)). An example of conditions for the plasma treatment is shown below.

| | |
|---|---|
| Ammonia flow rate | 50–5,000 sccm |
| Nitrogen flow rate | 0–5,000 sccm |
| (A flow rate ratio of ammonia to nitrogen is preferably set to be 0.01–1.0.) | |
| Pressure | 1–10 Torr |
| High-frequency power | 100–1,000 W, preferably 100–500 W |
| Substrate temperature | 300–450° C., preferably 350–400° C. |
| Treatment time period | 1 sec-10 min |

In this plasma treatment, it is preferable to use a source gas comprising a nitrogen element and more preferable to use the gas further comprising a hydrogen element to provide a reducing nature. In this way, a copper nitride layer of high quality can be formed without damaging the surface of the copper-containing film. For a source gas, a mixed gas of nitrogen and hydrogen, a mixed gas of ammonia and nitrogen and mixed gases in which other components are appropriately added into either of these above mixed gases can be preferably used. Among these, a mixed gas of ammonia and nitrogen is particularly preferable, because, with this, a copper nitride layer of high quality can be formed well under control. Hereat, a ratio of the amount (volume ratio) of ammonia to the whole mixed gas is set to be preferably 1–50 %. This setting can prevent the degradation of the copper surface and, at the same time, facilitate to form a copper nitride layer of high quality.

Next, on the copper interconnection 17, a silicon nitride film 18 is formed as a copper-diffusion prevention film. The silicon nitride film 18 can be formed by the plasma CVD (Chemical Vapour Deposition) method. The conditions of the film growth can be set, for instance, as follows.

| | |
|---|---|
| SiH$_4$ flow rate | 50–2,000 sccm, preferable 50–300 sccm |
| Ammonia flow rate | 10–2,000 sccm |
| (A flow rate ratio of ammonia to nitrogen is preferably set to be 0.01–0.7.) | |
| Pressure | 1–10 Torr |
| High-frequency power | 100–1,000 W, preferably 100–500 W |
| Substrate temperature | 300–450° C., preferably 350–400° C. |

Figure 3:
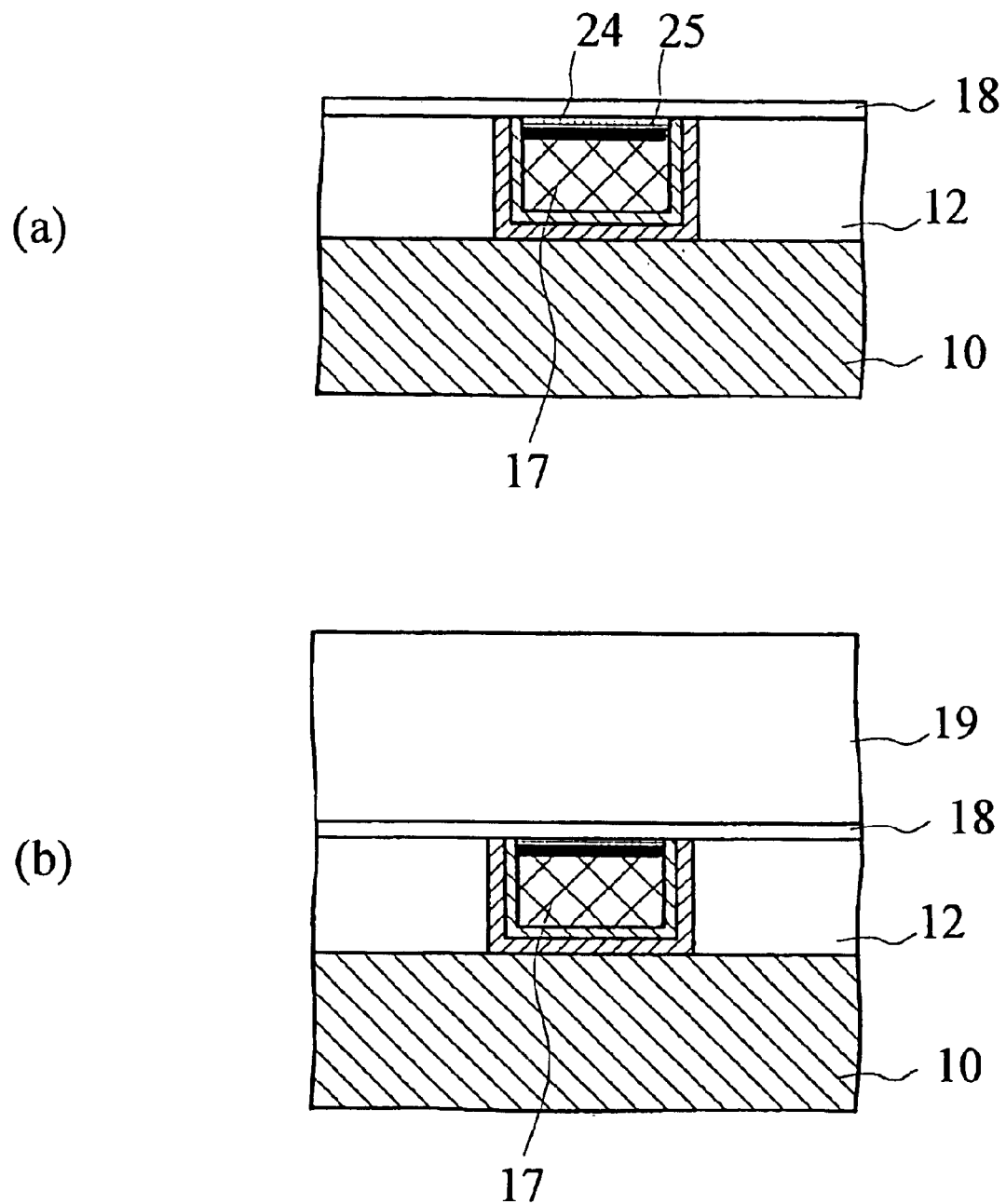
FIG. 3 is a series of schematic cross-sectional views illustrating further steps of the manufacturing method of a semiconductor device according to the present invention.

In this step of film growth, silicon is diffused, through the copper nitride layer 24, into the copper interconnection 17, to form a copper silicide layer 25 (FIG. 3(a)). Hereat, the presence of the copper nitride layer 24 can suppress diffusion of silicon from the silicon nitride film 18 into the copper interconnection 17 and, therefore, the film thickness of the copper silicide layer becomes less, compared with the case the copper nitride layer 24 is not provided. Further, because the plasma treatment is carried out, as described above, in a state where copper oxide on the surface of the copper interconnection 17 is removed, the copper nitride layer 24 can be formed homogeneously to an uniform thickness. Therefore, it is possible to suppress the increases in interconnection resistance and contact resistance and, at the same time, achieve an improvement of the interconnection lifetime.

Hereat, both of the plasma treatment and the film growth described above are carried out, using a parallel plate type plasma generation equipment. Within this plasma generation equipment, the steps from the step of a heating treatment to make the anticorrosive detached to the step of formation of a silicon nitride film are performed. Since the vacuum state is maintained throughout these steps, the oxidation of the copper surface can be prevented from occurring and the nitriding treatment can be conducted, while the clean surface thereof is maintained.

Figure 4:
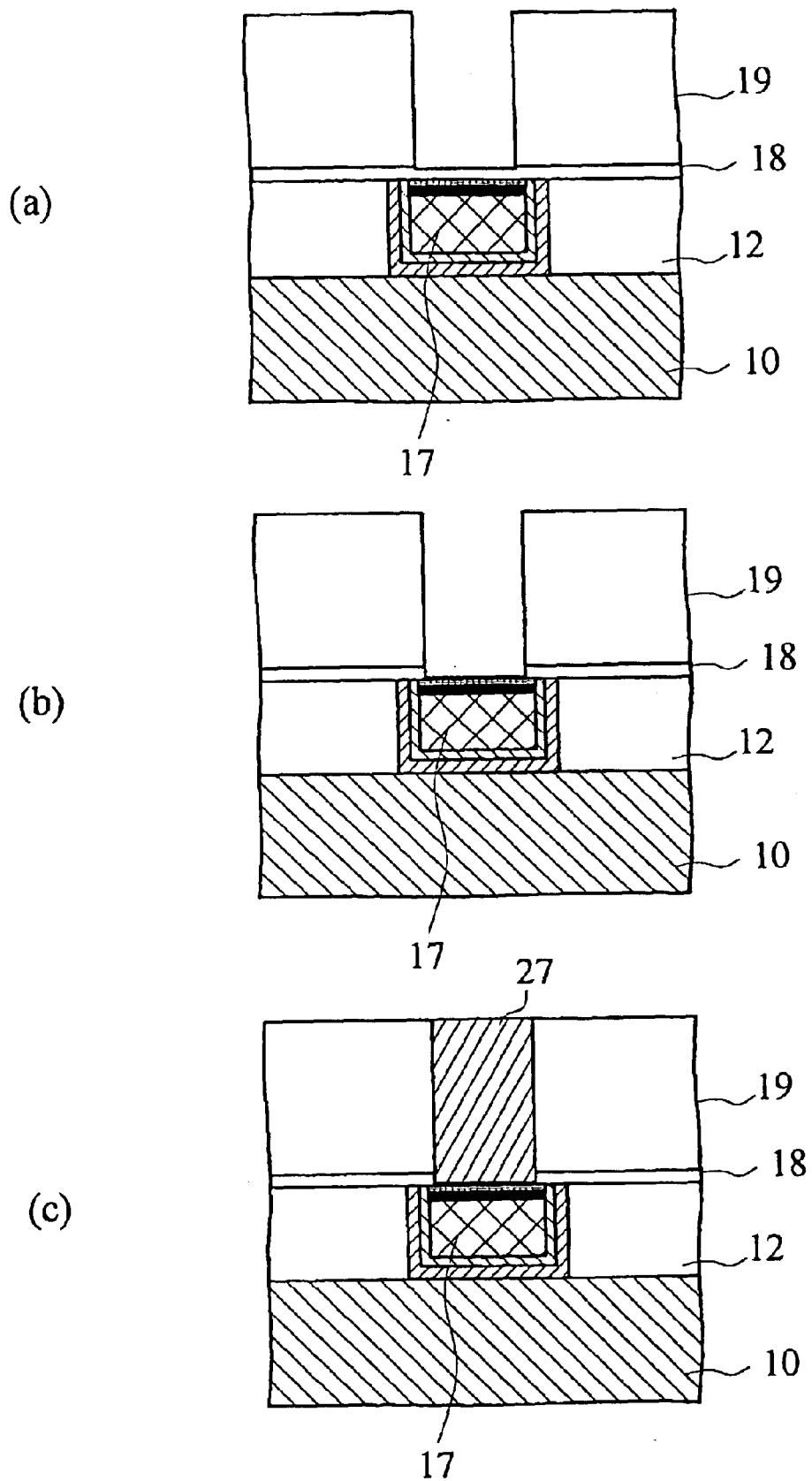
FIG. 4 is a series of schematic cross-sectional views illustrating further steps of the manufacturing method of a semiconductor device according to the present invention.
Figure 5:
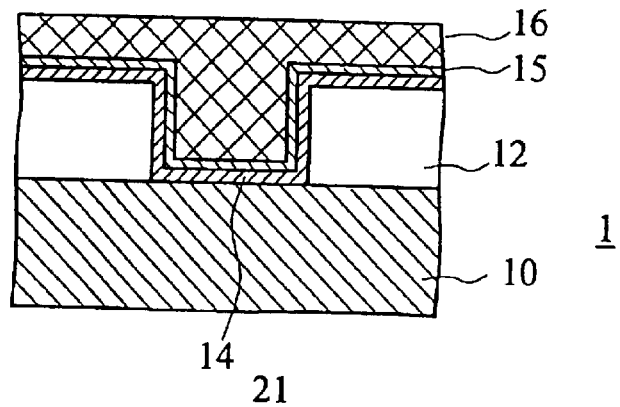
FIG. 5 is a series of schematic cross-sectional views illustrating the steps of a conventional manufacturing method of a semiconductor device.
Figure 5:
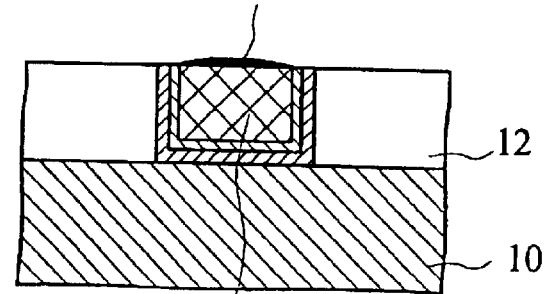
Figure 5:
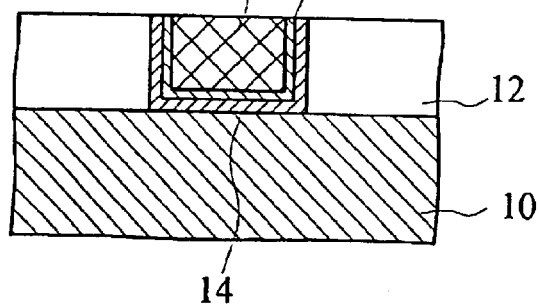
Figure 5:
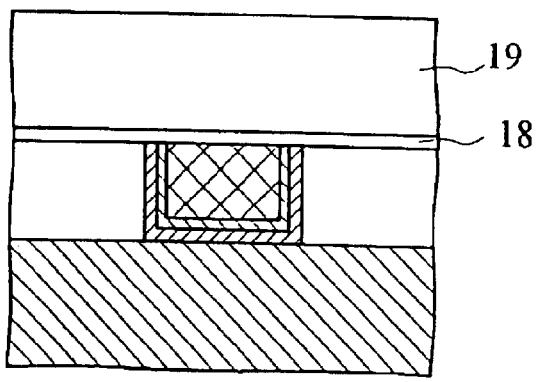

Next, after an interlayer insulating film 19 is formed from silicon oxide (FIG. 3(b)), a via hole is formed by dry etching. Firstly, as shown in FIG. 4(a), an interlayer insulating film 19 is etched and then, as shown in FIG. 4(b), a silicon nitride film 18 is etched to expose the copper interconnection 17 at the bottom section of the hole. Hereat, in order to expose the copper interconnection 17 for sure, a certain overetching is, in general, required. In the present embodiment, because the copper nitride layer 24 is homogeneously formed to a uniform thickness as described above, the silicon nitride film 18 can be also formed to a uniform thickness well under control. The overetching time period can be, therefore, held down to the minimum.

After that, by filling up the inside of the via hole with metal such as copper or tungsten, an interlayer connecting plug 27 is formed, and, thus, forming a multi-layered interconnection structure (FIG. 4(c)).

The above description is made for an example of a method employing a series of steps wherein, after forming a copper interconnection 17, copper oxide is removed by a cleaning agent, and, then, after an anticorrosive treatment is conducted, a nitriding treatment is carried out. It is, however, possible not to include the step of a cleaning or an anticorrosive treatment in a manufacturing method of the present invention. In such a case, after growing a copper-containing film, the surface of the copper-containing film is subjected to a nitriding treatment without being exposed to an oxygen-containing atmosphere. For instance, there can be employed a manufacturing method in which, after a copper film is grown and then patterned by means of etching or the like, it is subjected to a nitriding treatment, while keeping as it is, even without taking out from a plasma chamber. This makes the nitriding treatment applied to the surface in a state where no copper oxide is substantially formed so that a copper silicide layer can be formed homogeneously to a thin uniform thickness, allowing to achieve both a lowering of the electrical resistance and an improvement of the interconnection lifetime, at the same time.

EXAMPLE 1

Using a method of manufacturing a semiconductor device according to the present invention, copper interconnections were formed and their interconnection lifetimes and resistances were evaluated. The method of fabricating the copper interconnection is described below. First, by the plasma CVD method, a silicon oxide film was formed on a silicon wafer. Next, by dry etching, a plurality of interconnection trenches patterned into a prescribed shape were formed. Next, after a barrier metal film was formed from Ta by the sputtering method, a seed copper film and a plating copper film were formed in this order.

Subsequently, the wafer surface was polished by the CMP method so as to leave copper inside of the interconnection trenches, and thereby a copper interconnection was formed. Next, for the purpose of removing polishing grains, particles such as polishing shavings, metals and slurries, which were adhered onto the surface of the semiconductor wafer, the following steps of cleaning were performed.

First, a scrub cleaning was made. That is, particle contaminations were removed by moving a rotating brush, while spraying a cleaning agent made of electrolytic ionized water onto the brush. Next, a spin cleaning was made. In this step, while rotating the semiconductor wafer, a cleaning agent made of an aqueous solution containing 0.03 wt. % of oxalic acid was sprayed thereto for 10 seconds to remove copper oxide and then rinsing with pure water was carried out.

Next, an anticorrosive treatment was made. The agent for the anticorrosive treatment used herein had the following components.

| Benzotriazole | 0.1 wt. % |
|---|---|
| Water | the rest |

While rotating the semiconductor wafer, this agent for the anticorrosive treatment was sprayed onto the wafer surface with a flow rate of 1 liter/min for 10 seconds, and thereby an anticorrosive treatment was applied onto a Cu film. After that, the step of spin rinsing/drying, wherein after rinsing with pure water was conducted for 15 seconds, drying was made, was performed.

Subsequently, a plasma treatment was carried out, using a mixed gas of ammonia and nitrogen, and the surface of the copper interconnection was nitrided. After that, using a source gas made of $SiH_4$, ammonia and nitrogen, a silicon nitride film was formed, by the plasma CVD method, to a thickness of 50 nm on the copper interconnection. After that, an interlayer insulating film was formed thereon, and a plug to bring into contact with the copper interconnection was set, whereby a copper interconnection for the evaluation was accomplished.

Case 1 for Comparison

Copper interconnections were formed in the same way as Example 1 except that, after the oxalic acid treatment, not a BTA treatment but only an ammonia plasma treatment was performed and thereafter a silicon nitride film was formed.

Case 2 for Comparison

Copper interconnections were formed in the same way as Example 1 except that, after the oxalic acid treatment, not an ammonia plasma treatment but only a BTA treatment was performed and thereafter a silicon nitride film was formed.

Figure 6:
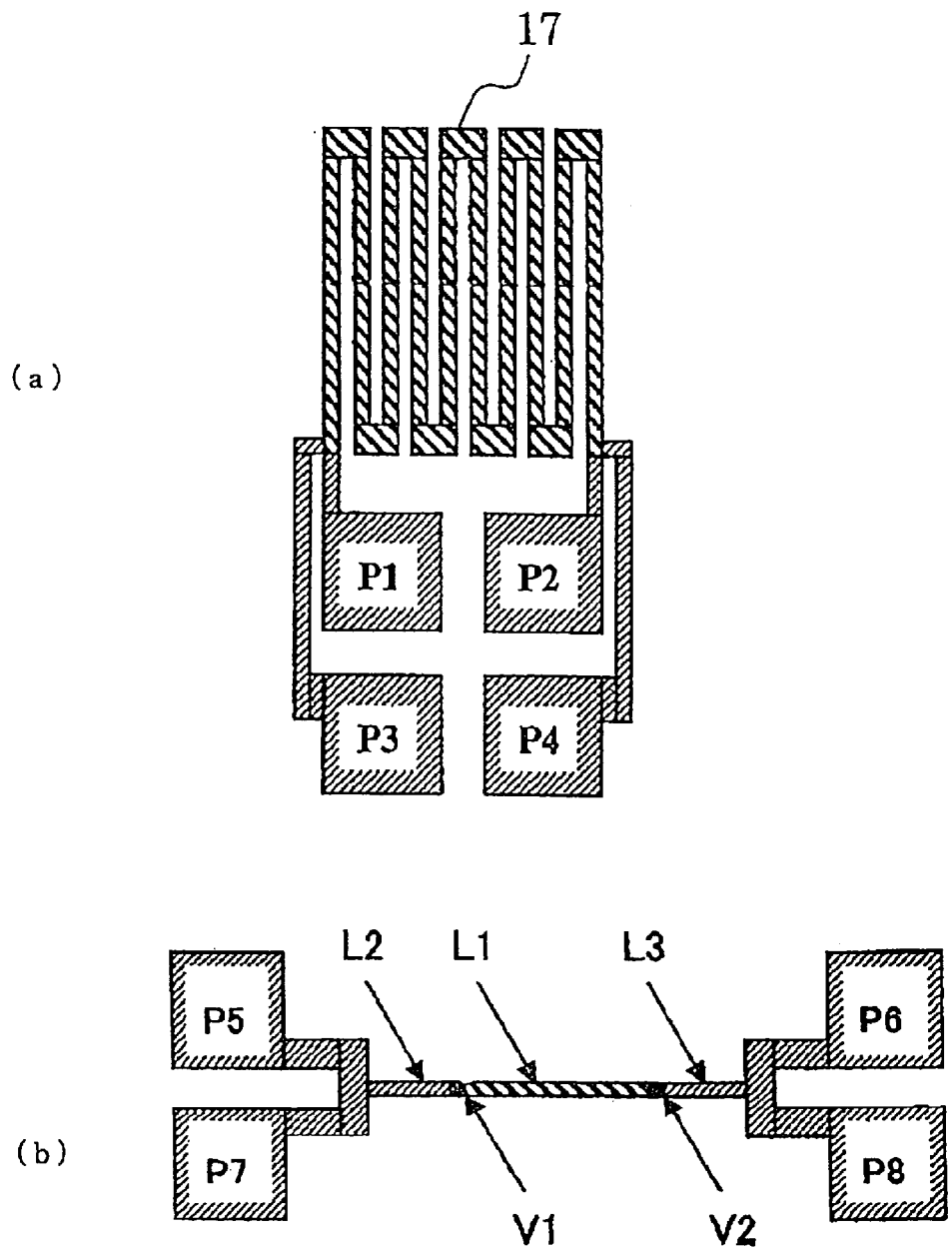
FIG. 6 is a pair of views in explaining a method of evaluating the interconnection resistances and the interconnection lifetimes in Examples.

The copper interconnections fabricated as described in Example 1 and Cases 1 and 2 for Comparison have planar structures shown in FIGS. 6 (a) and (b). The interconnection resistances and the interconnection life times for these copper interconnections were evaluated. With respect to the interconnection resistance, the evaluation was made through the value of resistance (E1/I1) which was obtained by making an electric current (I1) flow between terminals for measurement P3–P4 of FIG. 6(a), while increasing from 0 A to 1 mA, and measuring the potential difference (E1) generated thereat between both ends P1–P2 of the measuring element. Regarding the interconnection lifetime, the evaluation was made through the measurement of the time period for the deviation of the value of resistance (E2/I2) to reach 3%, owing to the degradation, when a given current (I2) in the range of 0.01 mA–10 mA was kept to flow between terminals for the measurement P5–P6 of FIG. 6(b) in a given atmosphere (at a given temperature and such) and the potential difference (E2) generated between P7–P8 was measured.

Figure 7:
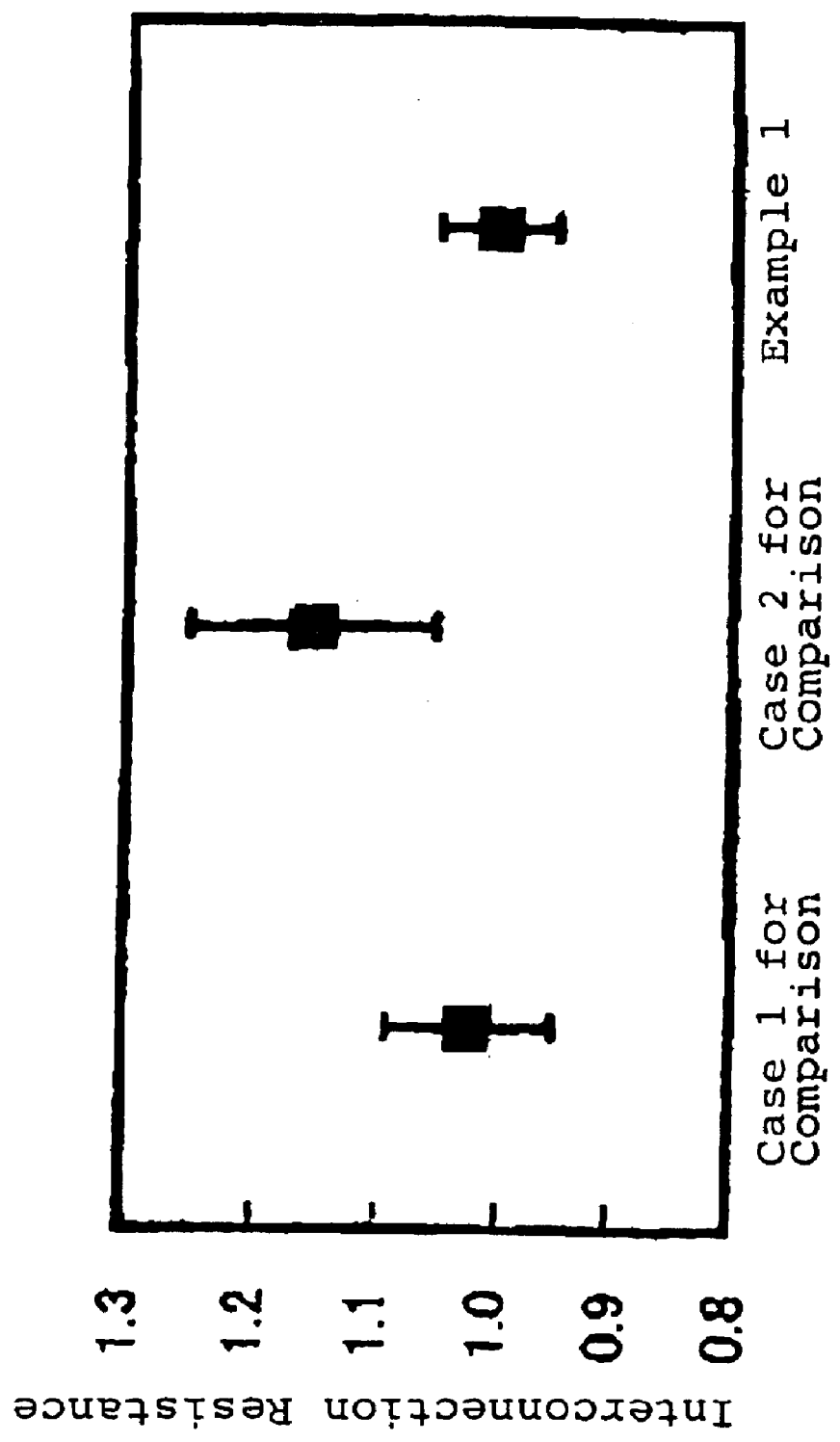
FIG. 7 is a graph showing the evaluation results of the interconnection resistances in Examples.
Figure 8:
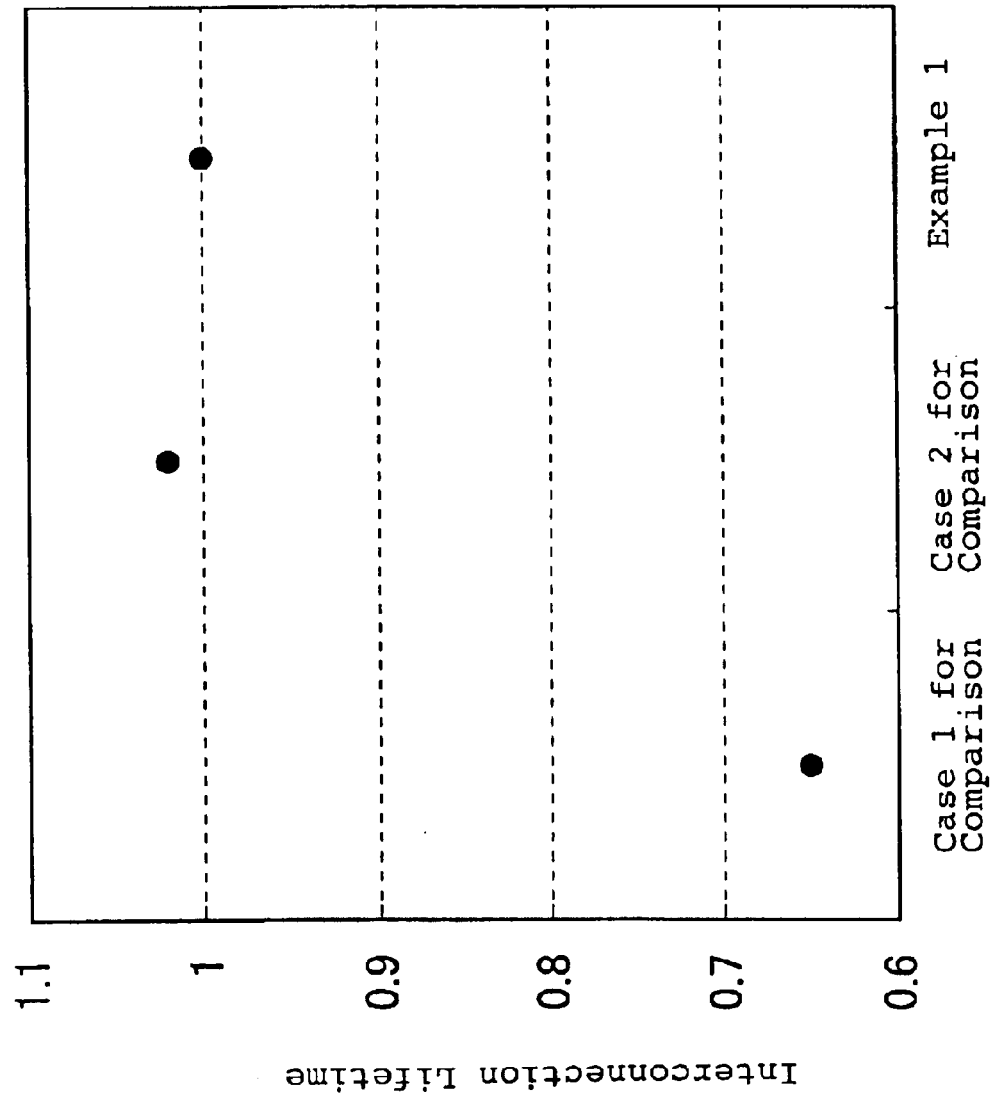
FIG. 8 is a graph showing the evaluation results of the interconnection lifetimes in Examples.

The results are shown in FIG. 7 and FIG. 8. In both of these graphs, the value of Example 1 is taken as 1, and the values of Cases for Comparison are expressed in reduced values, respectively. For the interconnection resistance in FIG. 7, the lower its value is, the better it is. For the interconnection lifetime in FIG. 8, the higher its value is, the better it is. Case 1 for Comparison has excellent interconnection resistances but their variations among elements are considerable and besides the interconnection lifetimes are short. Meanwhile, Case 2 for Comparison has the long interconnection lifetimes but large interconnection resistances with substantial variations. As against these, it is clearly demonstrated that the interconnections of Example 1 have both excellent interconnection lifetimes and interconnection resistances and besides variations in interconnection resistances among elements are small.

Case 1 for Reference

On a silicon wafer, a silicon oxide film is formed and thereon a copper plating film is formed over the entire surface. Following that, after the copper surface was polished by the CMP method, for the purpose of removing polishing grains, particles such as polishing shavings, metals and slurries, the following steps of cleaning were performed.

First, a scrub cleaning was made. That is, particle contaminations were removed by moving a rotating brush, while spraying a cleaning agent made of electrolytic ionized water onto the brush. Next, a spin cleaning was made. In this step, while rotating the semiconductor wafer, a cleaning agent made of an aqueous solution containing 0.03 wt. % of oxalic acid was sprayed thereto for 10 seconds to remove metal contaminations which are CuO lying on the surface, and then rinsing with pure water was carried out.

Next, an anticorrosive treatment was made. The agent for the anticorrosive treatment used herein had the following components.

| Benzotriazole | 0.1 wt. % |
|---|---|
| Water | the rest |

While rotating the semiconductor wafer, this agent for the anticorrosive treatment was sprayed onto the wafer surface with a flow rate of 1 liter/min for 10 seconds, and thereby an anticorrosive treatment was applied onto a Cu film. The wafer in this state is designated as Sample 1.

Sample 1 is further subjected to a plasma treatment under the following conditions and, with the surface of the copper film therein being nitrided, is designated as Sample 2.

| Flow gas | Ammonia and nitrogen |
|---|---|
| | The total flow rate 5,000 sccm |
| | Flow rate ratio of ammonia to nitrogen is 1 to 50. |

-continued

| | |
|---|---|
| Pressure | 5 Torr |
| High-frequency power | 200 W |
| Substrate temperature | 400° C. |
| Treatment time period | 20 seconds in a state without applying high-frequency power, and 5 seconds in a state with applying high-frequency power |

Sample 1 and Sample 2 obtained as described above are each subjected to a treatment for the initial stage of the steps of forming a silicon nitride film by the plasma CVD method. That is, $SiH_4$ was added to the above flow gas in the atmosphere at 400° C. and held for 5 seconds. The pressure was set to be 5 Torr and the high-frequency power, 200 W.

Figure 9:
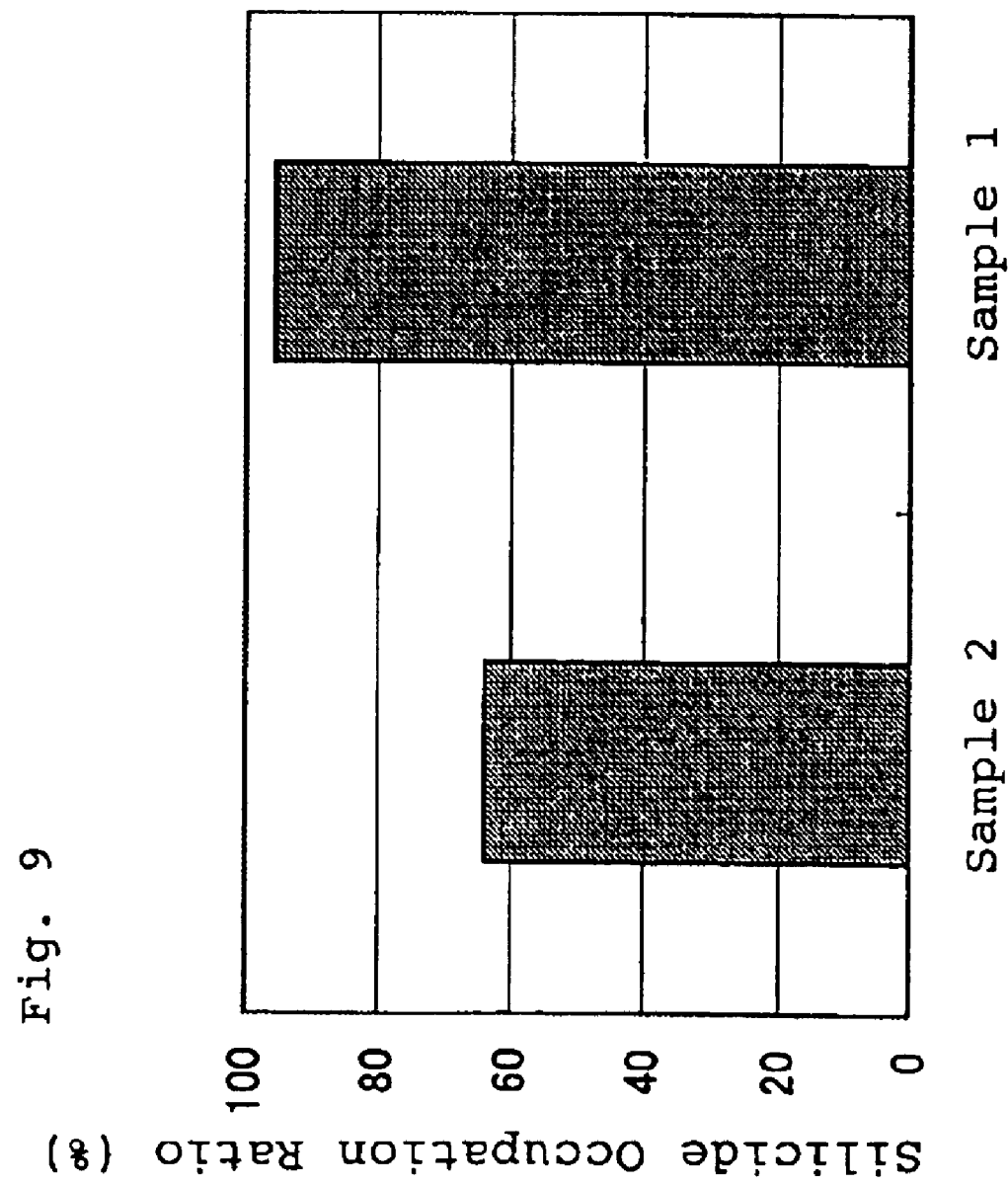
FIG. 9 is a graph showing the evaluation results of the silicide occupation ratios in Cases for Reference.

The occupation ratios of silicide formed on the surface of the copper film after the above treatment was completed were observed for respective samples. The observation was made by applying wet etching with a mixed solution of ammonia and hydrogen peroxide to the copper films after the above treatment. While copper and copper oxide are soluble in the above mixed solution, copper silicide is insoluble. Therefore, the insoluble portion signifies copper silicide. When elementary analysis of the insoluble portion was conducted by the SIMS (Secondary Ion Mass Spectroscopy), copper and silicon were actually detected. On the basis of results from such observations, an occupation ratio of the copper silicide area that is insoluble in etching with respect to the whole area of the copper film that has been originally present is defined as a silicide occupation ratio. The results of the experiments are shown in FIG. 9. It is evident that the formation of silicide was well suppressed in Sample 2 whose copper surface was nitrided with the ammonia plasma treatment. These results of the experiments confirm that nitridation of the copper surface suppresses copper silicide formation.

What is claimed is:

1. A method of manufacturing a semiconductor device; which comprises the steps of:

forming a copper-containing film on a semiconductor substrate;

removing, with a cleaning agent, a copper oxide on a surface of said copper-containing film;

applying a nitriding treatment to the surface of said copper-containing film from which the copper oxide has been removed; and forming a copper-diffusion prevention film comprising a silicon on said copper-containing film which has been subjected to the nitriding treatment.

2. A method of manufacturing a semiconductor device according to claim 1, wherein, following the step of removing copper oxide on the surface of said copper-containing film, the step of applying the nitriding treatment to the surface of said copper-containing film is performed, without allowing the semiconductor substrate on which said copper-containing film from which copper oxide has been removed is formed to be exposed to an oxygen-containing atmosphere.

3. A method of manufacturing a semiconductor device according to claim 1, wherein the nitriding treatment applied to the surface of said copper-containing film is effected by a plasma treatment with a source gas comprising a nitrogen element being used.

* * * * *